United States Patent [19]

Carolus et al.

[11] 4,163,274

[45] Jul. 31, 1979

[54] UNIFIED CHASSIS FOR A TWO-WAY RADIO

[75] Inventors: Walter E. Carolus, Wheaton; Bryan L. Cullen, Crystal Lake; Stanley W. Gorcik, Buffalo Grove, all of Ill.

[73] Assignee: Motorola, Inc., Schaumburg, Ill.

[21] Appl. No.: 853,160

[22] Filed: Nov. 21, 1977

Related U.S. Application Data

[63] Continuation of Ser. No. 688,624, May 21, 1976, abandoned.

[51] Int. Cl.² .............................................. H05K 5/00
[52] U.S. Cl. .................................... 361/417; 361/395
[58] Field of Search ................. 333/79, 70 R, 70 CR, 333/12, 706; 325/357; 339/198 K; 361/394, 391, 422, 395, 424, 417

[56] References Cited

U.S. PATENT DOCUMENTS

| 2,915,679 | 12/1959 | Swale | 361/391 |
| 3,129,396 | 4/1964 | Germain et al. | 333/79 |
| 3,504,188 | 3/1970 | Ficker | 361/424 |

*Primary Examiner*—David Smith, Jr.

[57] ABSTRACT

A base station radio chassis has upper and lower compartments for receiving the transmitter and receiver modules, respectively, therein. Electrical interconnections between the two modules are established by a centralized "mother" board. A unique chassis interconnect assembly rigidly connects the mother board to the two compartments as well as providing a means to mechanically mount and electrically shield low pass filter components, which carry audio and DC signals between the mother board and the modules.

2 Claims, 2 Drawing Figures

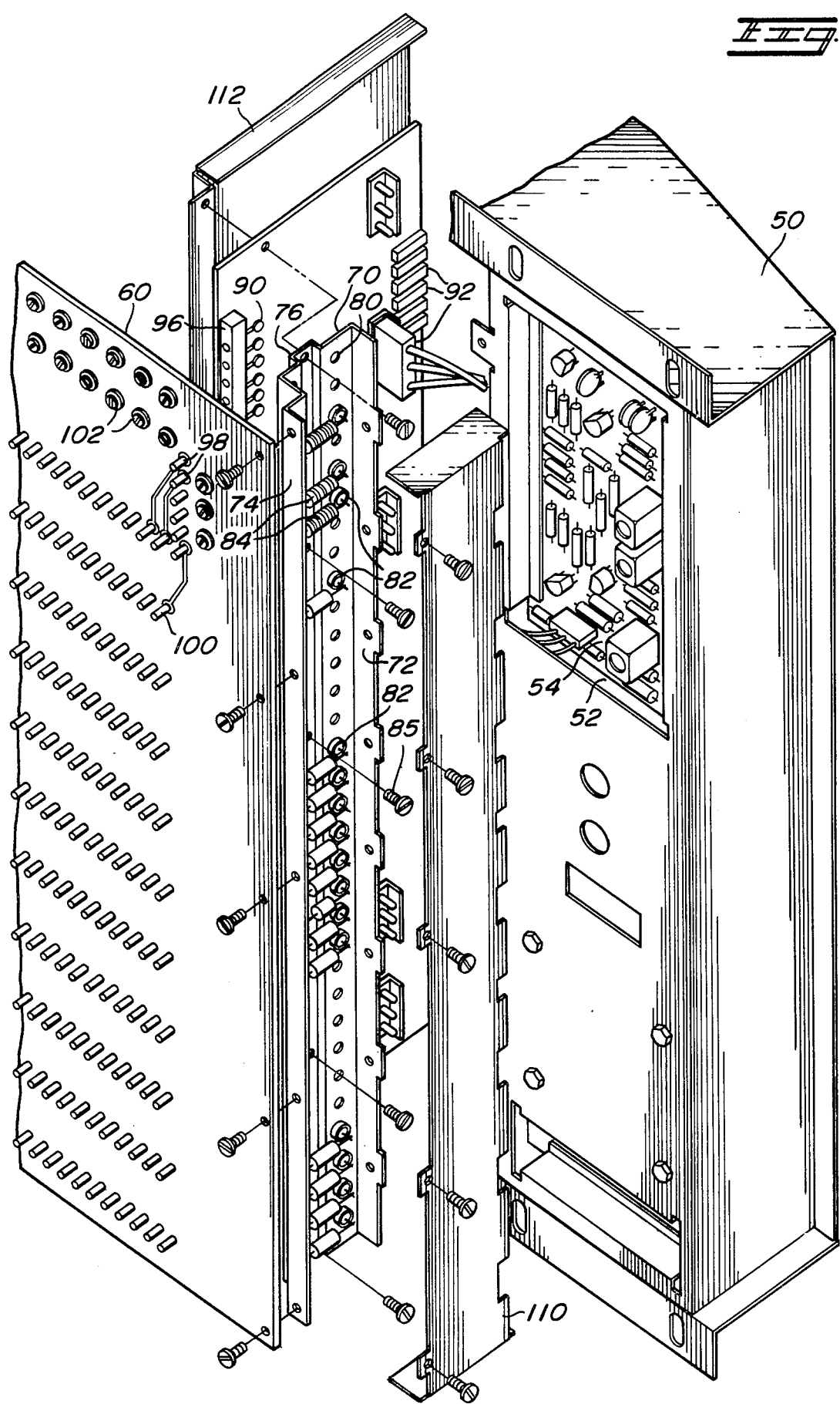

UNIFIED CHASSIS FOR A TWO-WAY RADIO

This is a continuation of application Ser. No. 688,624, filed May 21, 1976 now abandoned.

BACKGROUND OF THE INVENTION

The present invention relates to the electrical component chassis art and, in particular, to a radio chassis interconnect structure which provides mechanical and electrical interconnection between two electrical circuits.

Electrical component chassis are well known, especially in the radio construction art. Radio chassis adapted for two-way radios have presented conflicting problems to the chassis designer. The trend is to a smaller radio chassis. However this brings the two-way radio's transmitter and receiver closer together. The radio frequency (RF) signal from the transmitter, if allowed to couple into the receiver circuitry, may desensitize the receiver, or result in a spurious response therefrom, rendering the receiver useless for its intended purpose. The closer the proximity of the transmitter to receiver the more likely it becomes that intercoupling between the two will affect two-way operation.

In addition, RF signals from external sources, if allowed to couple into the receiver may similarly desensitize it, and if coupled into the transmitter may result in spurious transmitter outputs.

Quite often lines carrying audio and/or DC signals must interconnect the transmitter and receiver. If not properly shielded and filtered, these lines can pick up RF signals from the transmitter and couple them to the receiver circuitry, resulting in the aforementioned undesired receiver desensitization and spurious responses.

The heretofore best approach to isolating the transmitter from the receiver of a two-way radio station is illustrated in FIG. 1. There, a transmitter module 10 is shown containing a number of internal electrical components (generally indicated by numeral 12) and an external heat sink 14. Connections to and from the electrical components 12 of the transmitter module 10 are accomplished via an edge connector 16 containing a number of metallized fingers, one of which is indicated at 18. Each finger 18 of the edge connector 16 is intended to couple either an audio frequency signal or a DC signal to or from the module 10. To prevent the strong RF signal generated by the transmitter for coupling to each of the output fingers 18 and thus possibly to the associated receiver module (not shown) a cover plate 20, having a filter housing 22 thereon is affixed via a plurality of screws over the electrical components 12 of the transmitter module 10. Contained within the housing 22 is an edge connector socket adapted to receive and connect to each electrical finger 18. Mounted to one edge of the housing 22 is a plurality of pi-section low pass filters, each filter 24 being comprised of a pair of feed through capacitors 26, 28 which are intercoupled by a series inductor 30. Each low pass filter 24 has selective component values to pass only audio and DC frequencies, thus filtering out undesired RF signals. The filters intercouple each finger 18 from the transmitter module 10 to a corresponding finger 32 which extends from the housing 22 for external connection to subsequent radio modules. A cover 40 secures to the housing 22 via a plurality of screws. The cover 40 mechanically protects and electrically shields the components of the low pass filters.

Subsequent radio modules, such as the receiver module, could electrically connect to each housing 22 finger 32 for receiving or sending the RF free audio or DC signal thereon.

This prior art two-way radio station has been costly to manufacture as well as being bulky in use due largely to the housing 22 which contains the low pass filter components. A substantial savings in manufacturing cost as well as in valuable space would be realized if the interconnecting structure between two or more modules could be accomplished without the use of the bulky filter housing.

SUMMARY OF THE INVENTION

It is an object of this invention, therefore, to provide an improved electrical component chassis which employs a novel interconnecting structure for interconnecting between two or more electrical component structures.

It is a particular object of the invention to provide an interconnecting structure which provides both mechanical and electrical interconnection between the two or more electrical component assemblies, which electrical connection includes RF isolation.

Briefly, according to the invention, an electrical component chassis comprises first and second electrical circuit structures and electrical components which electrically intercouple these structures. An interconnect means forms a rigid mechanical interconnection between the first and second electrical structures as well as being adaptable for mechanically mounting and electrically shielding the electrical intercoupling components thereon. Preferably, the components form low pass filters which couple only audio and DC signals between the first and second electrical circuit structures. The interconnect means is preferably a metallic "U" shaped channel having first and second end flanges and an interior curved portion. Each end flange is adapted to be mechanically affixed to one of the first and second circuit structures, and the interior curved portion is provided with a means for receiving and mounting the electrical components therein.

BRIEF DESCRIPTION OF THE DRAWINGS

FIG. 2 illustrates a preferred embodiment of the radio chassis, according to the invention.

DESCRIPTION OF THE PREFERRED EMBODIMENT OF THE INVENTION

Figure 1:
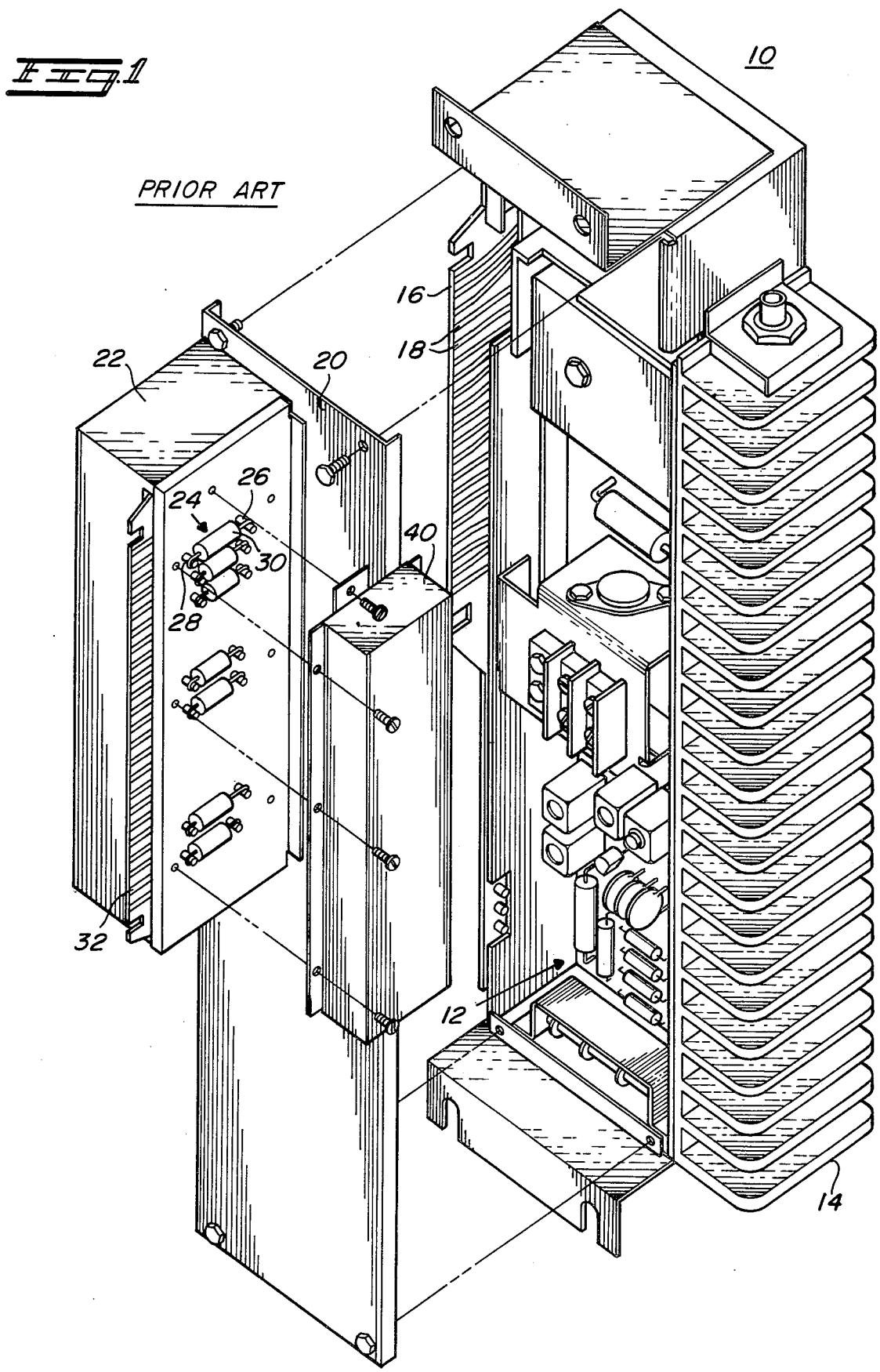
FIG. 1 is an exploded view of the prior art radio frequency chassis.

Shown in FIG. 2 is a cutaway, exploded view of a unified two-way radio station chassis. The chassis has a frame 50 formed to create a right compartment 52 and a left compartment (not shown). The lower compartment houses a receiver module 54 whereas the upper compartment houses a corresponding transmitter module (not shown). A centralized "mother" board 60 provides a means to electrically interconnect the receiver module 54 to the transmitter module.

It should be understood that the upper compartment is part of the same chassis as the lower compartment being symmetrical thereto on the opposite side of the mother board.

As mentioned hereinabove, spurious RF signals, which, for example, may be generated by the transmitter, if coupled to the receiver module 54 might adversely affect the operation thereof. Thus it is important that interconnections between the transmitter and receiver modules be shielded against RF interference.

A unique interface structure provides both mechanical and electrical coupling between the receiver module 54, the transmitter module and the mother board 60. The interconnecting structure includes a "U" shaped metallic channel 70 which has first and second end flanges 72, 74 respectively and an interior curved portion 76. The interior curved portion 76 is provided with mounting holes, one of which being indicated by numeral 80, to which may be mounted electrical components. In the present example of the invention since only audio and DC signals are to be passed between the receiver and transmitter and the mother board, pi section low pass filters are constructed within the "U" shaped channel 70. Each pi-section filter is comprised of a first feedthrough capacitor 82, a second feedthrough capacitor (not shown) and a series inductor 84 coupled therebetween. The feedthrough capacitors are of the standard type wherein their outer casing is one terminal of the capacitor, whereby mechanically affixing the capacitor to the "U" channel electrically connects the terminal to chassis or ground potential through the mounting screws, one of which is indicated at 85. The values of the capacitors and inductors are selected whereby they form a standard low pass filter having a rolloff characteristic which passes audio and DC signals but rejects RF signals. The ends of the feedthrough capacitors which extend to the backside of the "U" shaped channel mount into a first set of eyelets (not shown) and a second set of eyelets 90. The first set of eyelets couple, via a printed circuit pattern, to an interconnecting structure 92 which in turn connects to the appropriate portions of the receiver module 54. In the preferred embodiment of the invention, the receiver module 54 is comprised of a series of plug in circuit boards. Each board is provided with edge connectors (not shown) which mate with the interconnecting structure 92. The second set of eyelets 90 connects to receptacles 96, which in turn mate with corresponding pins 98 provided in the mother board 60. A printed circuit metallic pattern on the mother board 60 connects the pins to selected terminals, one terminal being indicated at 100 on the mother board. There terminals in turn connect to electrical components or other metal runs which may connect to external terminals, one external terminal being indicated by reference numeral 102, or to pins, on the other side of the mother board, which in turn connect to the transmitter module.

Since the pi-section electrical components are mounted in the interior curved portion of the "U" shaped metallic channel, the channel provides substantial electrical isolation to the components from an external RF signal. Additional RF isolation is provided by a metallic cover member 110 which, via provided holes, mounts, via screws, over the interior curved portion of the "U" shaped channel. Isolation is also provided by a rear metallic cover member 112 which mounts over the back portion of the interconnect board.

Thus, the "U" shaped channel provides both a rigid mechanical interconnection between the mother board 60 and the receiver module 54 as well as being a principle element in the electrical intercoupling between the board and the module.

Comparing the improved radio chassis of FIG. 2 to the prior art chassis of FIG. 1 it should become readily apparent that the improved structure is considerably less expensive to manufacture, as well as consuming only a fraction of the space.

While a preferred embodiment of the invention has been described in detail, it should become apparent that many modifications and variations thereto are possible all of which fall within the true spirit and scope of the invention.

For example, while the preferred embodiment of the invention discloses means for interconnecting a module with a circuit board, it should be clear that the invention contemplates interconnection between any two, or more, electrical circuit structures.

We claim:

1. An electrical component chassis comprising:
   a first electrical circuit structure;
   a second electrical circuit structure;
   electrical components for electrically intercoupling the first and second circuit structures; and
   interconnect means for forming a rigid mechanical interconnection between the first and the second electrical circuit structures, said interconnect means comprising a pair of metallic "U" shaped channels, each channel having first and second end flanges and an interior curved portion, the first end flange of each "U" shaped channel being adapted to be mechanically affixed to one of the first and second electrical circuit structures, and the interior curved portion provided with means for receiving and mounting the electrical components therein; and a central circuit board structure, said central circuit board being adapted to be mechanically affixed to each "U" channel second end flange for forming a rigid mechanical interconnection between said first and second circuit structures, said central circuit board having electrical circuitry thereon for coupling signals between said first and second circuit structure.

2. The chassis of claim 1 wherein the interconnect means further comprises a pair of metallic cover members, each cover member adapted for mounting over the interior curved portion of one of the "U" shaped channels for providing additional electrical shielding to the electrical components mounted therein.

* * * * *